(12) United States Patent
Matsuoka

(10) Patent No.: US 7,313,931 B2
(45) Date of Patent: Jan. 1, 2008

(54) METHOD AND DEVICE FOR HEAT TREATMENT

(75) Inventor: Takaaki Matsuoka, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/211,493

(22) Filed: Aug. 26, 2005

(65) Prior Publication Data

US 2005/0279138 A1  Dec. 22, 2005

Related U.S. Application Data

(62) Division of application No. 10/466,604, filed as application No. PCT/JP02/00515 on Jan. 24, 2002, now Pat. No. 6,951,815.

(30) Foreign Application Priority Data

Jan. 25, 2001  (JP) .............................. 2001-016471

(51) Int. Cl.
C03B 5/24 (2006.01)
(52) U.S. Cl. .............................. 65/162; 65/355; 65/356; 438/660; 438/715; 219/399; 219/414; 118/719; 118/724
(58) Field of Classification Search .................. 65/355, 65/356, 162; 438/660, 663, 715, 795; 219/399, 219/414, 390, 411, 405; 118/719, 724, 666, 118/712, 725
See application file for complete search history.

(56) References Cited

U.S. PATENT DOCUMENTS 6,143,083 A * 11/2000 Yonemitsu et al. ......... 118/719
6,291,801 B1 * 9/2001 Guidotti et al. ............. 219/390
6,387,812 B1   5/2002 Andreas
6,462,310 B1 * 10/2002 Ratliff et al. ............... 219/390
6,497,767 B1 * 12/2002 Okase et al. ................ 118/666

FOREIGN PATENT DOCUMENTS

| | | |
|---|---|---|
| EP | 1 033 743 A2 | 9/2000 |
| EP | 1033743 | 9/2000 |
| JP | 10-22266 | 1/1998 |
| JP | 2000-323487 | 11/2000 |
| JP | 2001-133606 | 5/2001 |
| KR | 1999-023451 | 3/1999 |

* cited by examiner

Primary Examiner—Mark Halpern
(74) Attorney, Agent, or Firm—Crowell & Moring LLP

(57) ABSTRACT

After carrying an LCD substrate in a reaction container of a heat treatment unit, blowing a previously heated helium gas from a gas supply part, which opposes to the surface of the LCD substrate, over the entire surface of the LCD substrate. The temperature of the LCD substrate is raised by radiation heat of a heater and heat exchange with the helium gas. After performing CVD or annealing in the reaction container, cooling the LCD substrate by blowing a gas for heat exchange having a temperature about a room temperature from the gas supply part over the entire surface of the LCD substrate. Return the cooled LCD substrate to a carrier in the carrier chamber via a conveyance chamber.

9 Claims, 6 Drawing Sheets

METHOD AND DEVICE FOR HEAT TREATMENT

CROSS-REFERENCE TO RELATED APPLICATIONS

This application is a divisional of application Ser. No. 10/466,604 filed 18 Jul. 2003, now U.S. Pat. No. 6,951,815, which is a 371 of PCT/JP02/00515 filed 24 Jan. 2002.

TECHNICAL FIELD

The present invention relates to heat treatment method and heat treatment apparatus and, more particularly, to a heat treatment method and a heat treatment apparatus which are used for manufacturing semiconductors.

BACKGROUND ART

A liquid crystal panel is used as a display of computers or televisions. A glass substrate for liquid crystal displays (hereinafter, referred to as an LCD substrate) has been enlarged increasingly in recent years. Various semiconductor manufacturing processes are performed for forming devices such as a thin film transistor (TFT) on the LCD substrate. Among such processes, a heat treatment process is performed by a single-wafer type cold-wall heat treatment apparatus, which processes substrates one by one. This apparatus heats a substrate carried in a chamber from above by a heating lamp. As for a large-size LCD substrate, since heat radiation from a circumferential edge is large, it is preferable to use a hot-wall type heat treatment apparatus which heats a substrate while heating walls of a reaction container by a heater surrounding the reaction container.

Meanwhile, recently, in order to achieve a higher throughput, a system referred to as a cluster tool is used, which is constituted by connecting airtightly a carrier chamber, which performs carry-in and carry-out of a substrate carrier, to a conveyance chamber in which a convey arm is installed and further connecting airtightly a plurality of heat treatment chambers to the conveyance chamber.

The hot-wall type heat treatment apparatus requires a long time for heating and cooling a substrate. For example, when a substrate is attracted onto a placement stage by an electrostatic chuck as in a cold-wall type heat treatment apparatus, a rapid heat exchange can be performed between the substrate and the placement stage by supplying a heating medium to an extremely small gap between the backside of the substrate and the placement stage. However, since the electrostatic chuck cannot be used in the hot-wall type, a large gap is present between a substrate and a placement stage. For this reason, if an attempt is made to take measures of a cold-wall type, especially in a case of a large-size LCD substrate, it is difficult to cool down uniformly and rapidly. Therefore, when an attempt is made to incorporate a hot-wall type heat treatment apparatus which performs a heat treatment of an LCD substrate, it takes a long time to heat and cool the substrate by the heat treatment apparatus, and, thus, there is a problem in that a function of a high throughput which is provided by a cluster tool cannot be sufficiently used.

DISCLOSURE OF INVENTION

It is a general object of the present invention to provide an improved and useful heat treatment apparatus and heat treatment method in which the above-mentioned problems are eliminated.

A more specific object of the present invention is to provide a heat treatment apparatus and method which can achieve a high throughput when applying a heat treatment to a glass substrate.

In order to achieve the above-mentioned objects, there is provided according to one aspect of the present invention a heat treatment method of performing a heat treatment using a heat treatment apparatus constituted by connecting airtightly a carrier chamber which a substrate is carried in and carried out, a conveyance chamber for conveying the substrate and a hot-wall type heat treatment unit for heat-treating the substrate, a glass substrate for liquid crystal displays being taken from a substrate carrier in the carrier chamber by conveying means in said conveyance chamber and being conveyed into said heat treatment unit in which a heat treatment is applied to the glass substrate, the method comprising: a step of conveying the glass substrate from said conveyance chamber into a reaction container inside said heat treatment unit; a step of heating an interior of said reaction container at a process temperature so as to apply a heat treatment to the glass substrate; a step of supplying a gas for heat exchange to a surface of said glass substrate so as to perform heat exchange between said glass substrate and the gas in at least one of a step of raising a temperature inside said reaction container to the process temperature and a step of decreasing the temperature of the reaction container after the heat treatment; and a step of carrying the heat treated glass substrate out of said reaction container.

In the above-mentioned present invention, the gas for heat exchange is preferably blown from a gas supply part opposite to the surface of the glass substrate to substantially the entire surface of the glass substrate. Additionally, the gas for heat exchange is preferably adjusted previously to a predetermined temperature before being supplied to inside said reaction container. Specifically, for example, a first gas for heat exchange is supplied to the glass substrate in a step of raising the temperature inside said reaction container to a process temperature, and a second gas for heat exchange, which has a temperature lower than the temperature of said first gas for heat exchange, is supplied to said glass substrate in a step of decreasing the temperature inside said reaction container after the heat treatment.

Additionally, during a step of raising the temperature inside the reaction container to the process temperature, at least one of increasing an amount of the gas for heat exchange and raising a temperature of the gas for heat exchange before being supplied to the reaction container may be performed. Further, during a step of decreasing the temperature inside the reaction container to the process temperature, at least one of increasing an amount of the gas for heat exchange and decreasing a temperature of the gas for heat exchange before being supplied to the reaction container may be performed.

Further, the heat treatment method according to the above-mentioned present invention may includes a step of dividing the glass substrate placed in said reaction container into a plurality of areas and supplying independently a gas for heat exchange to each of the areas; a step of detecting a temperature of each of the divided areas of said glass substrate; and a step of controlling at least one of an amount of flow and a temperature of the gas for heat exchange to be supplied to each divided area. Thereby, heating and cooling of the glass substrate can be performed with a further higher in-plane uniformity.

Additionally, there is provided according to another aspect of the present invention a heat treatment apparatus constituted by connecting airtightly a carrier chamber which a substrate is carried in and carried out, a conveyance chamber for conveying the substrate and a hot-wall type heat treatment unit for heat-treating the substrate, a glass substrate for liquid crystal displays being taken from a substrate carrier in the carrier chamber by conveying means in said conveyance chamber and being conveyed into said heat treatment unit in which a heat treatment is applied to the glass substrate, comprising: a placement part for placing the glass substrate in said reaction container; a gas supply part for supplying a gas for heat exchange to a surface of the glass substrate placed on the placement part; a flow passage opening and closing part provided to a gas flow path for delivering the gas to said gas supply part; a control part controlling the flow passage opening and closing part so as to supply a gas for heat exchange to said glass substrate in at least one of a step of raising a temperature inside said reaction container to the process temperature and a step of decreasing the temperature of the reaction container after the heat treatment.

Other objects, features and advantages of the present invention will become more apparent from the following detailed description when read in conjunction with the accompanying drawings.

BEST MODE FOR CARRYING OUT THE INVENTION

Figure 1:
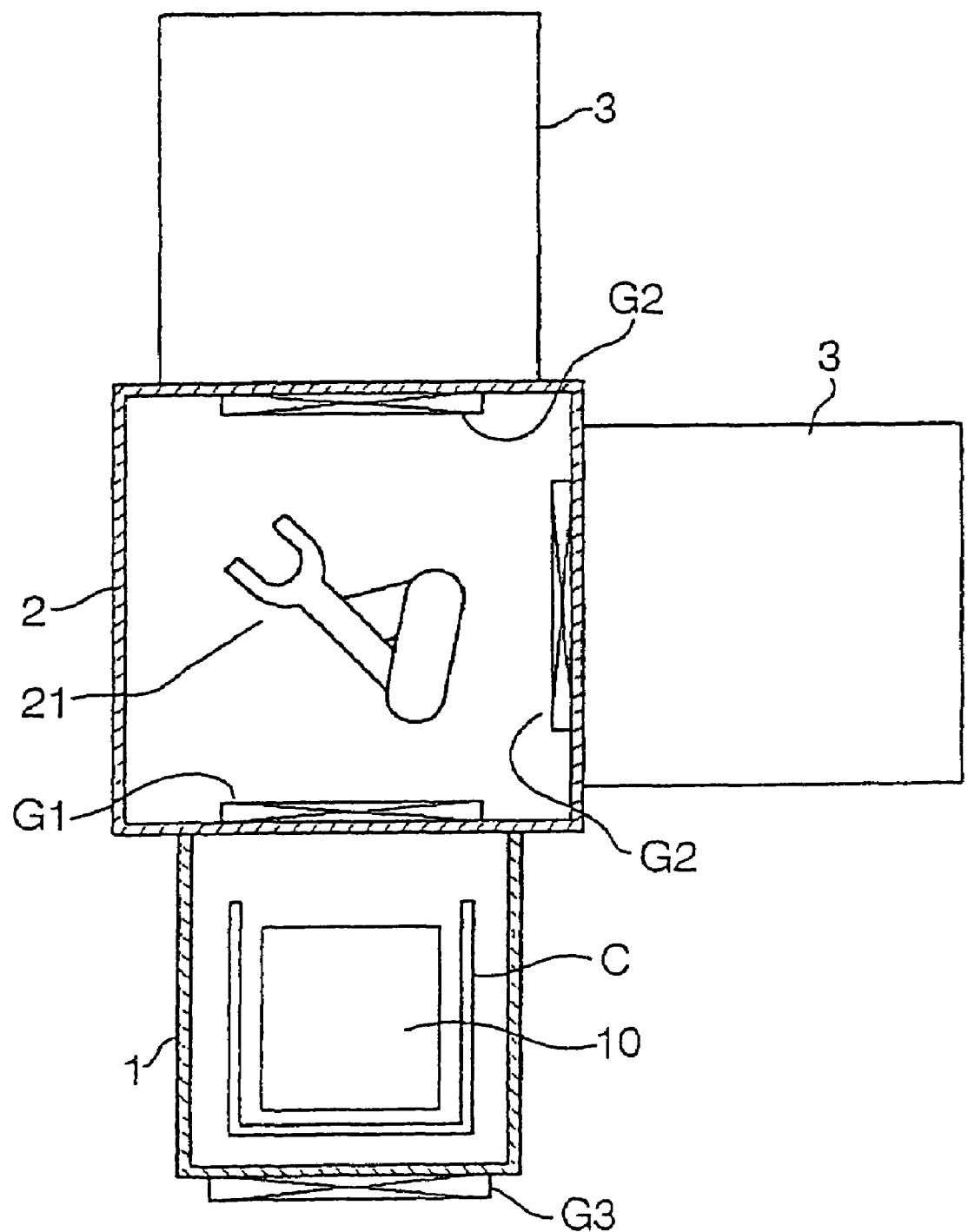
FIG. 1 is an illustrative plan view showing an entire heat treatment apparatus according to a first embodiment of the present invention.

A description will be given below, with reference to the drawings, of embodiments according to the present invention. It should be noted that the same parts in the drawings are give the same reference numbers.

FIG. 1 is a plan view showing an outline structure of a heat treatment apparatus according to a first embodiment of the present invention. The heat treatment apparatus shown in FIG. 1 comprises a carrier chamber 1, a conveyance chamber 2, and a plurality of hot-wall type heat treatment units 3 (two units in the figure).

The carrier chamber 1 and the conveyance chamber 2 are airtightly connected through a gate valve G1. Additionally, the conveyance chamber 1 and the heat treatment units 3 are connected through a gate valve G2, respectively.

The carrier chamber 1 is an airtight chamber for carrying in and out a carrier C, which is a convey tool for conveying a plurality of rectangular LCD substrates by retaining in a shelf-like state, between outside of the apparatus through a gate door G3. The conveyance chamber 2 provides a convey means 21 which comprises a multi-joint arm. The convey means 21 is constituted so that the LCD substrates 10 can be delivered between the carrier C in the carrier chamber 1 and so that the LCD substrates 10 can be delivered between the below-mentioned placement part of the heat treatment unit 3. The carrier chamber 1 and the conveyance chamber 2 are equipped with a gas supply and exhaust system which is not illustrated, and the inside thereof is made to be an inactive gas atmosphere.

Figure 2:
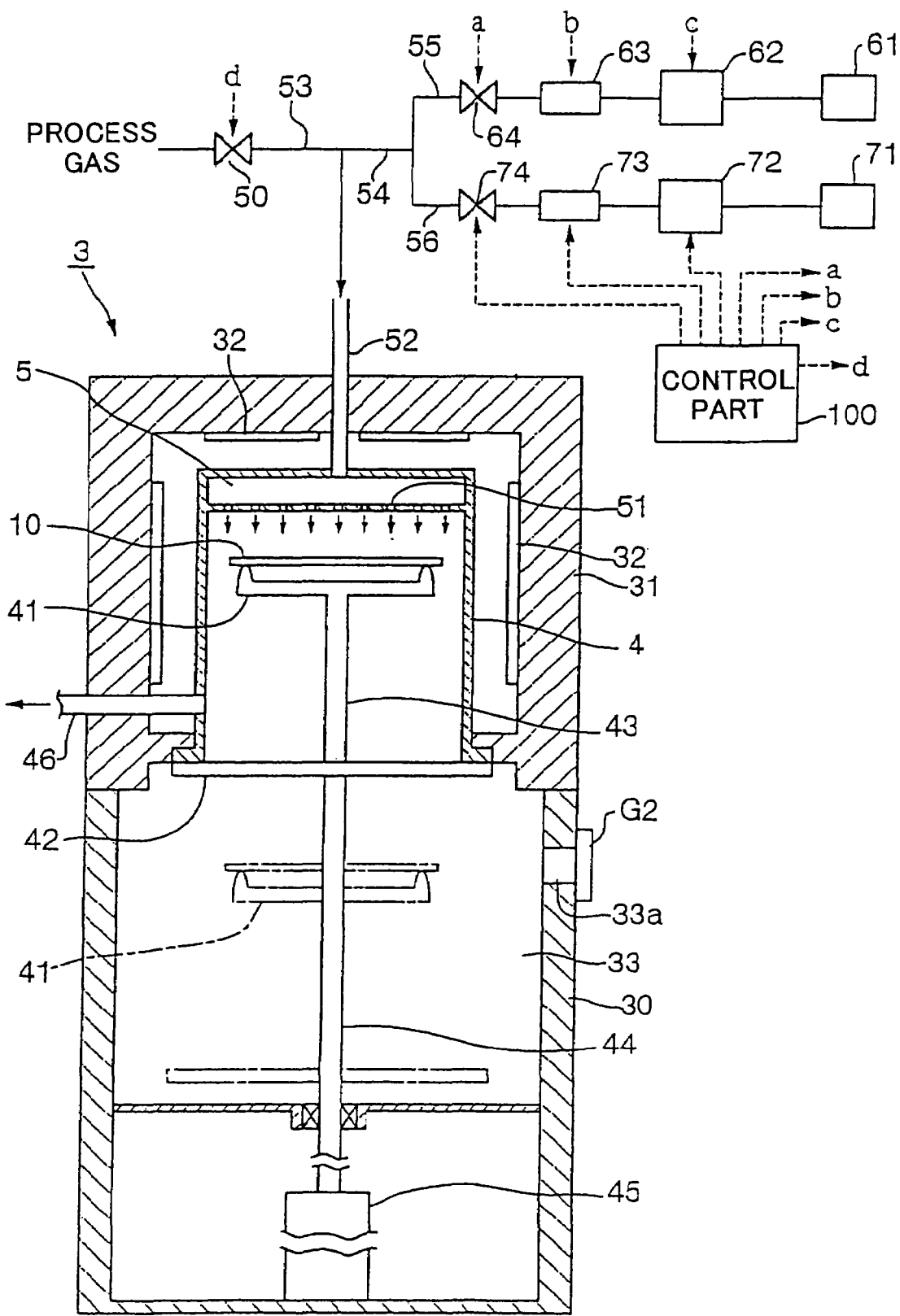
FIG. 2 is a cross-sectional view of a hot-wall type heat treatment unit used in the heat treatment apparatus shown in FIG. 1.

As shown in FIG. 2, in order to form a heat treatment atmosphere, the heat treatment unit 3 comprises: a quartz-made cylindrical reaction container 4 having an open bottom; a cylindrical insulator having an open bottom side and provided so as to surround the reaction container 4; a heater 32 which is provided on an inner surface and an outer surface of the insulator 31 and constitutes a furnace body together with the insulator 31; a transfer chamber 33 located on the bottom side of the reaction container 4 and surrounded by a housing 30; and a placement part 41 which holds the LCD substrates 10 at four points, for example, near the outer edge and moves up and down between the transfer chamber 33.

The placement part 41 is provided on a cap 42, which opens and closes a lower end opening part of the reaction container 4 through a support rod 43. The cap 42 is provided on an upper part of an up-and-down axis 44, and is moved up and down by an up-and-down mechanism 45 on the lower side of the transfer chamber 33. A conveyance opening 33a is formed on a sidewall of the transfer chamber 33 so that an arm of the convey means 21 shown in FIG. 1 can transfer the LCD substrates 10 between the placement part 41. The transfer chamber 33 is equipped with a gas supply and exhaust system which is not illustrated, and can form an inactive gas atmosphere. Moreover, although not illustrated, a cap which is sidable and movable up and down is provided in an upper part of the transfer chamber 33 so as to close the lower end opening of the reaction container 4 when the placement part 41 is located in the transfer chamber 33.

A gas-supply part 5 is provided on the upper part side of the reaction container 4, and an exhaust pipe 46 is connected to a lower part side. First, a description will be given of the exhaust pipe 46. The exhaust pipe 46 is constituted so that an exhaust can be performed by switching between a vacuum exhaust means not shown in the figure and an exhaust pump. For this reason, both a vacuum atmosphere and a normal-pressure atmosphere can be formed while evacuating the inside of the reaction container 4.

The gas-supply part 5 has many gas-ejecting holes 51 on a lower surface of a flat cylindrical part connecting the reaction container 4 so as to make an area opposite to an entire surface of the LCD substrate to be a gas-blowing area. A gas-supply pipe 52, which forms a gas-supply passage, is connected to the upper surface side of the gas-supply part 5. The gas supply pipe 52 is branched into a gas-supply pipe 53 for supplying a process gas and a gas-supply pipe 54 for supplying a gas for heat exchange.

The gas-supply pipe 53 is connected to a process gas supply source, which is not illustrated in the figure, through a valve VC, which is a flow-passage opening-and-closing part. The gas-supply pipe 54 is branched into a first gas-supply pipe 55 for supplying a first heat exchange gas (gas for heating) when heating the LCD substrate 10 and a second gas-supply pipe 56 for supplying a first heat exchange gas (gas for cooling) when cooling the LCD substrate 10. The first gas-supply pipe 55 is provided with a gas-supply source 61 of the first heat exchange gas, a supply source of, for example, a helium gas which is an inert gas, a temperature-control part 62 containing a heating part for adjusting the helium gas to a first temperature, a gas flow adjustment part 63 which consists of, for example, a mass flow meter and a valve 64 which is a flow-passage opening-and-closing part, in that order from an upstream side. Additionally, the second gas-supply pipe 56 is provided with a gas-supply source 71 of the second heat exchange gas, a supply source of, for example, a helium gas which is an inert gas, a temperature-control part 72 for adjusting the helium gas to a second temperature which is lower than said first temperature, a gas flow adjustment part 73 which consists of, for example, a mass flow meter and a valve 74 which is a flow-passage opening-and-closing part, in that order from an upstream side.

The first temperature, which is an adjustment temperature of the first heat exchange gas, is a temperature slightly lower than the temperature (process temperature) of the heat treatment atmosphere when performing a heat treatment. The second temperature, which is an adjustment temperature of the second heat exchange gas may be a room temperature, or may be a temperature between the room temperature and the process temperature. Although the temperature-control part 72 is provided with a heating part when setting the second temperature to a temperature higher than a room temperature, the temperature control part 72 is provided with a cooling part when setting the second temperature to a temperature lower than a room temperature.

It should be noted that, when setting the second temperature to a room temperature, it is not necessary to provide the temperature-control part 72. In this example, although the gas-supply pipe 55 of the first heat exchange gas and the gas-supply pipe 56 of the second heat exchange gas are separated, these gas-supply pipes 55 and 56 may be made common so as to commonly use the temperature-control part. In such a case, the temperature setting may be changed when supplying the first heat exchange gas and when supplying the second heat exchange gas.

The heat treatment apparatus is provided with a control part 100 as shown in FIG. 2. The control part 100 outputs signals for controlling valves 50, 64 and 74 so as to control supply and stop of a process gas and a heat exchange gas supplied to the reaction container 4. Additionally, the control part 100 has a series of sequence programs so as to perform a temperature control and a flow control of the first and second gases by outputting control signals for the temperature-control parts 62 and 72 and flow adjustment parts 63 and 73.

Figure 3:
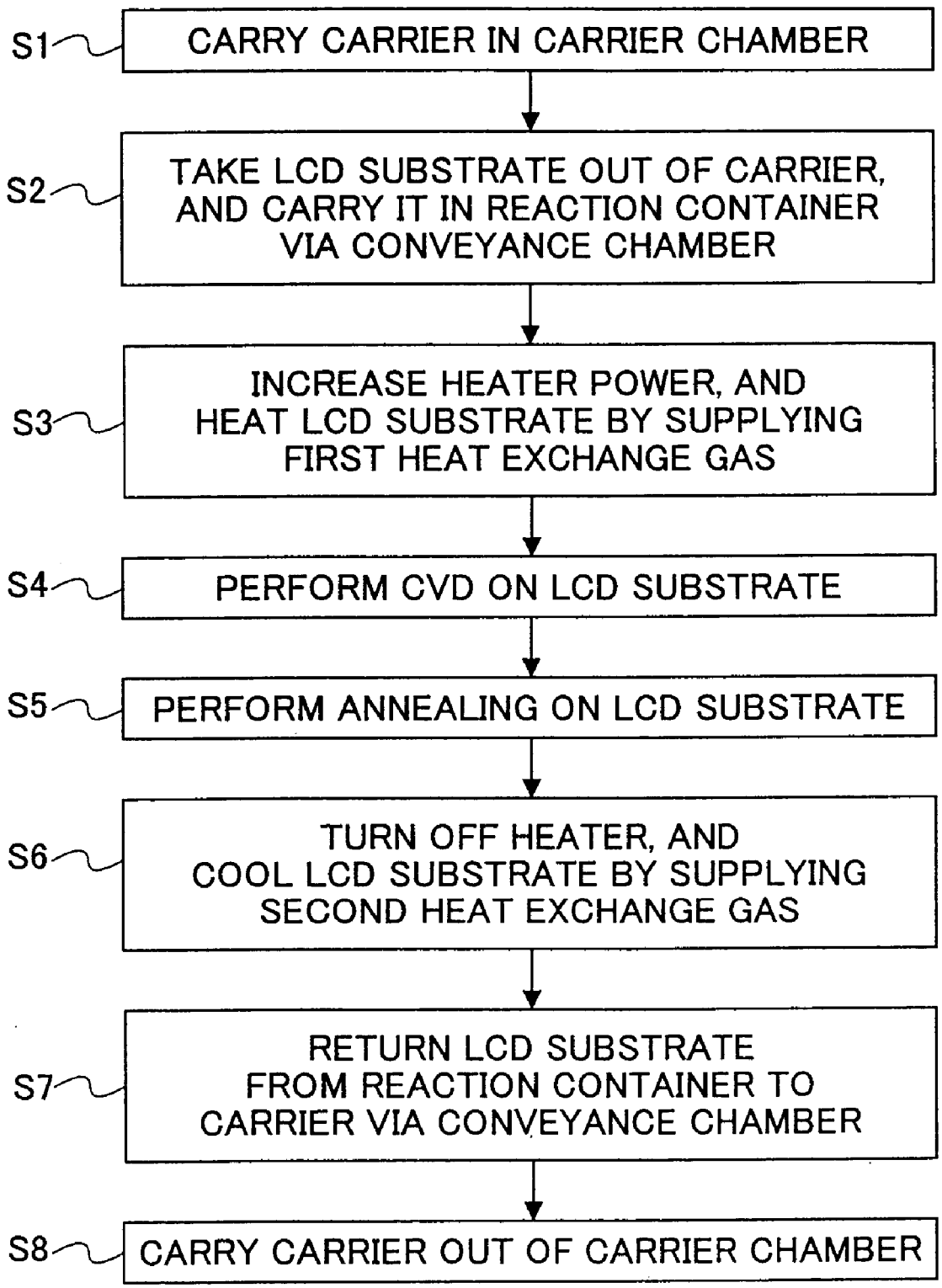
FIG. 3 is a flow chart of a process performed by the heat treatment apparatus shown in FIG. 1.

Next, a description will be given, with reference to the flowchart of FIG. 3, of a process in the above-mentioned embodiment. First, a carrier C, which retains a plurality of sheets of LCD substrates 10, is carried in from outside a carrier chamber 1 which is made into an inert gas atmosphere by being always supplied with, for example, an inert gas (step S1). After closing the gate door G3, gate valve G2 is opened so as to transfer the LCD substrate 10 to a placement part 41 in the transfer chamber 33 of one of the heat treatment units 3, and the LCD substrate 10 is carried in the reaction container 4 by the up-and-down mechanism 45 (step S2). The conveyance chamber 2 and the transfer chamber 33 are also made into an inert-gas atmosphere, and, therefore, the LCD substrate is transferred within the inert-gas atmosphere. Moreover, although the heater 32 is turned off, for example, when the LCD substrate 10 is carried in the reaction container 4, the temperature is higher than a room temperature since the heat by the heat treatment of the LCD substrate 10 remains.

When the placement part 41 moves up to an upper limit location, a lower-end opening of the reaction container 4 is closed by the cap 42. Thereafter, the valve 64 is opened so as to supply a first heat exchange gas, for example, a helium gas to an entire surface of the LCD substrate through the gas-ejecting holes 51 of the gas-supply part 5, the first heat exchange gas being heated by the temperature control part 62 to a temperature slightly lower than the process temperature of the heat treatment which will be performed from now. Additionally, the heater 32 is turned on to increase a power so as to heat the interior of the reaction container 4. Consequently, the temperature of the LCD substrate 10 rapid increases due to the radiation heat from the heater 32 and the conduction of heat from the hot helium gas. Then, the helium gas is also heated toward the process temperature as the calorific power of the heater 32 increases. Therefore, the temperature of the LCD substrate 10 uniformly increases up to the process temperature by the heat exchange with the helium gas (step S3). At this time, the inside of the reaction container 4 is, for example, in a normal pressure state, and is evacuated by an exhaust pump which is not illustrated through the exhaust pipe 46.

Then, the valve 64 is closed and evacuation of the inside of the reaction container 4 is carried out to a predetermined degree of vacuum by the evacuation means, which is not illustrated and connected to the exhaust pipe 46 and which are not illustrated. Thereafter, the valve 64 is closed and the valve 50 is opened to supply, for example, a process gas for CVD to inside the reaction container 4 so as to form a thin film on the LCD substrate 10 (step S4). It should be noted that the timing for evacuation may be before the LCD substrate 10 reaches the process temperature. After completion of the CVD process, an annealing process is performed subsequently. When the process temperature of the annealing process is higher than the process temperature of the CVD process, a heat exchange may be performed with LCD substrate 10, in addition to the heating by the heater 32, by supplying to the reaction container 4 a helium gas of which temperature is adjusted to a temperature higher than the process temperature of the CVD process, for example, by the temperature control part 62.

The annealing process is performed while supplying the process gas for anneal to the reaction container 4 in a depressurized-state of, for example, a viscous-flow range (step S5). After the annealing process is completed, the heater 32 is turned off, the valve 50 is closed and the valve 74 is opened so as to supply a helium gas, which is a second heat exchange gas, from the gas-supply part 5 to the reaction container 4. The helium gas is ejected over the entire surface of the LCD substrate 10 from the gas-ejecting holes 51 after being adjusted by the temperature control part 72 to a temperature (carrier carry-in allowable temperature) which does not give influence even if, for example, the LCD substrate 10 is carried to the carrier C. For this reason, the heat of the LCD substrate 10 is taken by the helium gas, and the LCD substrate is cooled quickly and uniformly (step S6).

At this time, the inside of the reaction container 4 is, for example, in the normal-pressure state, and is evacuated by the exhaust pump, which is not illustrated, through the exhaust pipe 46. It should be noted that the carrier carry-in allowable temperature is a temperature lower than 200 degrees.

After the LCD substrate 10 is cooled, the placement part 41 is moved down to the transfer chamber 33, and the LCD substrate 10 on the placement part 41 is conveyed to the original carrier C in the carrier chamber 1 by the conveyance means 21 (refer to FIG. 1) (step S7). Additionally, when the installation part 41 is moved down, the lower-end opening of the reaction container 4 is closed by the previously mentioned cap which is not illustrated. After all of the LCD substrates 10 in the carrier C are processed, the gate door G3 is opened and the carrier C is carried outside (step S8).

In the above-mentioned, as for an example of the consecutive process of CVD and annealing processes, there is an example in which a nature of a metal oxide film is changed within an oxygen gas atmosphere after producing the metal oxide film by CVD.

According to the above-mentioned embodiment, after the LCD substrate 10 is carried in the reaction container 4, the heated heat exchange gas is supplied over the entire surface of the LCD substrate 10 so as to raise the temperature of the LCD substrate by utilizing heat exchange with the gas in addition to the radiation heat from the heater 32, and, thereby, the LCD substrate 10 can be uniformly and rapidly heated over the entire surface thereof. Additionally, after the heat treatment, the low temperature heat exchange gas is supplied over the entire surface of the LCD substrate 10 so as to cool the LCD substrate 10 by utilizing heat exchange with the gas, and, thereby, the entire surface of the LCD substrate 10 can be cooled uniformly and rapidly to the carrier carry-in allowable temperature so that the LCD substrate can be immediately returned to the carrier C. Although it is more difficult to increase and decrease a temperature uniformly as the LCD substrate becomes larger, the temperature of the LCD 10 can be uniformly and rapidly increased and decreased according to the method of the present embodiment. Additionally, a high throughput is obtained while being able to suppress a thermal stress and being able to prevent a crack of a glass substrate or a damage of a device.

In the above-mentioned example, although CVD and anneal are performed in the same heat-treatment unit 3, those heat treatments may be performed in separate heat treatment units 3. Moreover, as for the consecutive process, there is a process in which an oxidation process for oxidizing a silicon film is performed and thereafter the oxidation film is annealed in a nitrogen gas atmosphere so as to nitride the surface thereof. It should be noted that the present invention is applicable to a case where a heat treatment such as a CVD, an oxidation process or a diffusion process is performed without performing a consecutive process.

Figure 4:
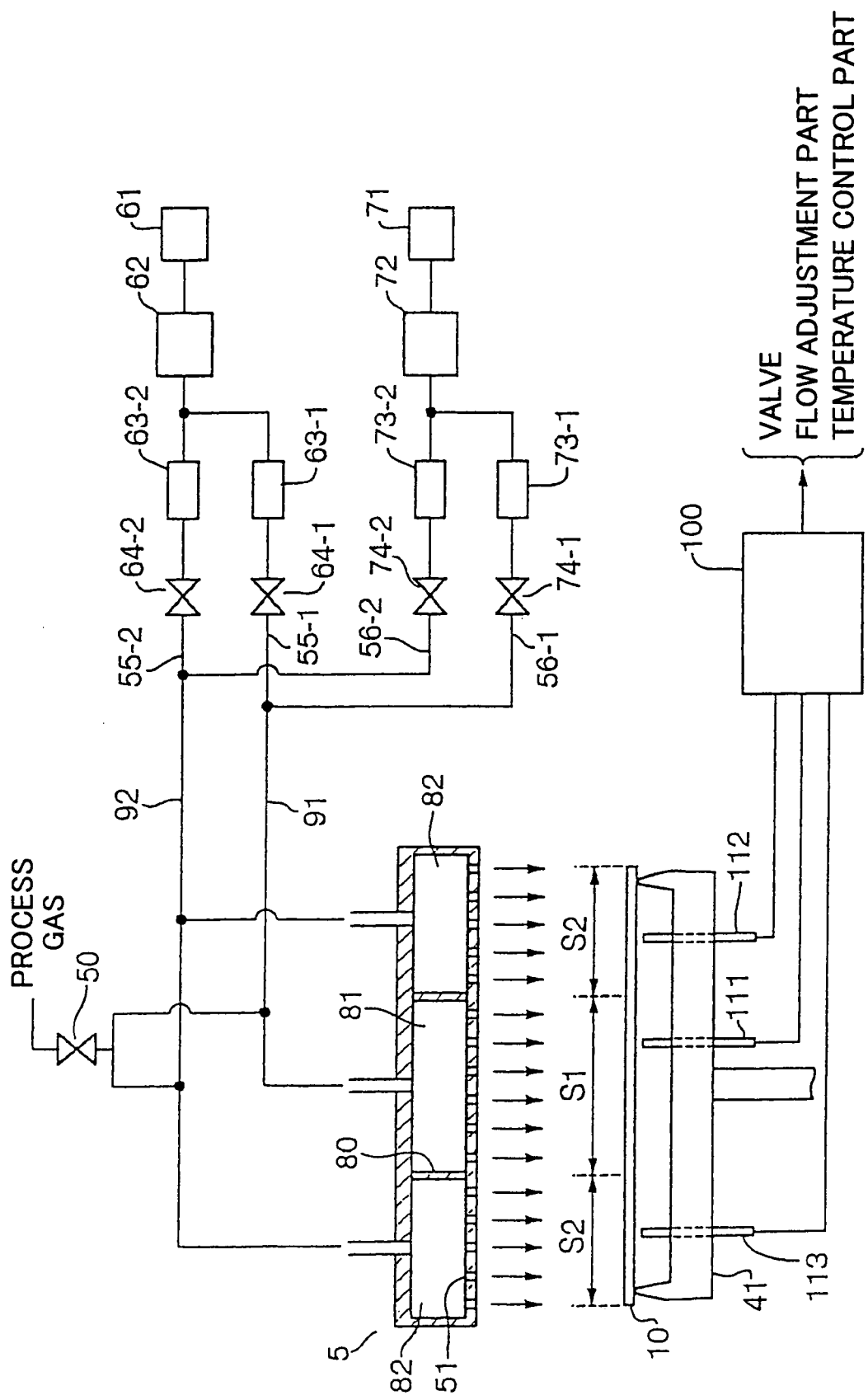
FIG. 4 is a structural diagram of a heat treatment apparatus according to a second embodiment of the present invention.
Figure 5:
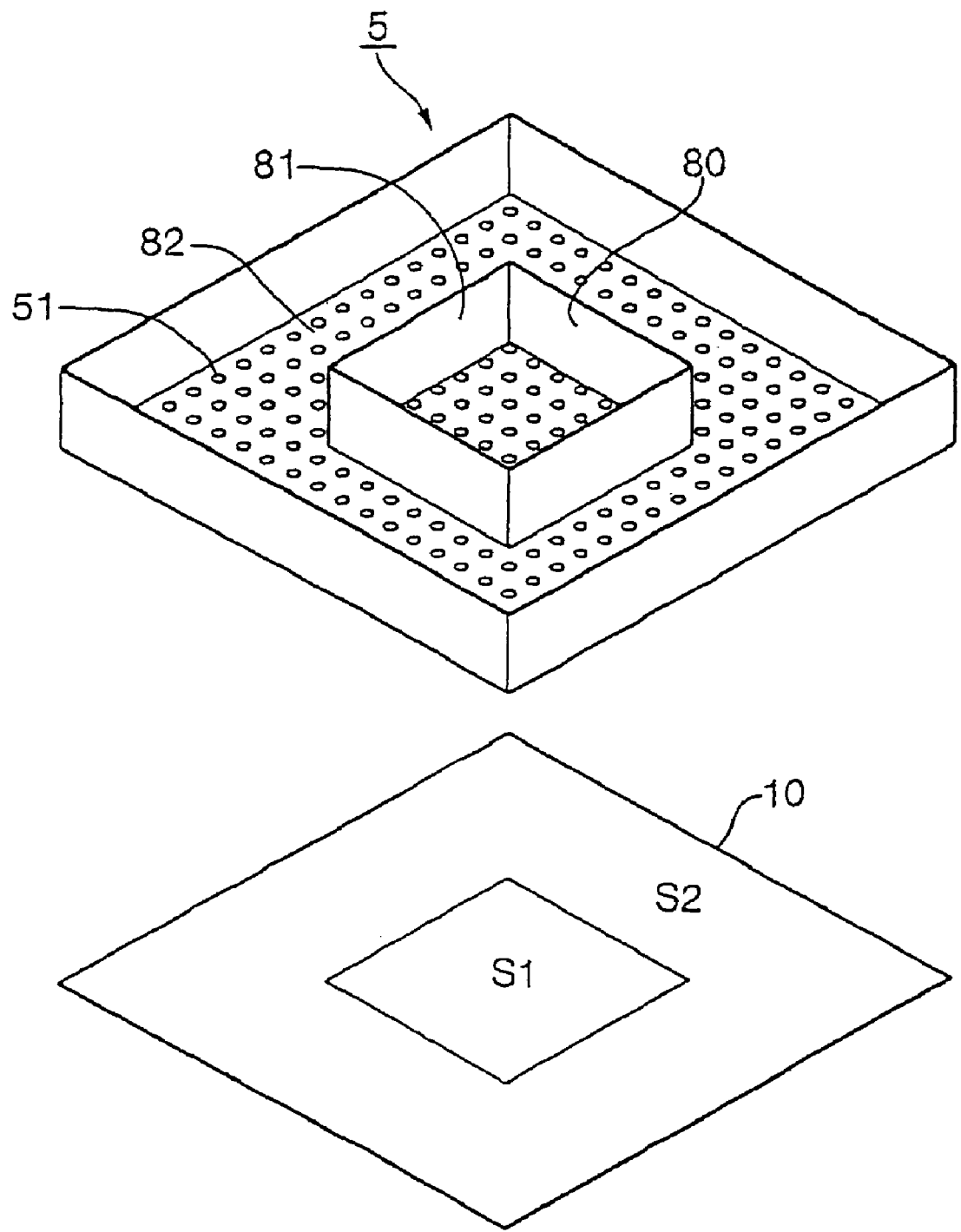
FIG. 5 is a perspective view of a gas supply part and an LCD substrate use in the heat treatment apparatus shown in FIG. 4.

Next, a description will be given, with reference to FIG. 4 and FIG. 5, of a second embodiment of the present invention. In the second embodiment of the present invention, the LCD substrate 10 on the placement part 41 is divided into a plurality of areas, that is, for example, two parts including a square shape center-section area S1 and an outside area S2 surrounding the center-section area S1 so that the first or second heat exchange gas can be supplied to the LCD substrate 10 independently for each divided area (the center-section area S1, outside area S2). Specifically, the gas-supply part 5 is divided by a partition wall 80 into a center-section partition chamber 81, which corresponds to the square center-section area S1, and an outside partition chamber 82 on an outer side. Additionally, each of the gas supply pipe 55 for the first heat exchange gas and the gas-supply pipe 56 for the second heat exchange gas is divided into two systems including a system for supplying a gas to the center-section partition chamber 81 and a system for supplying a gas to the outside partition chamber 82. The gas supply pipes indicated by the reference signs 55-1 and 55-2 in FIG. 4 are for supplying the first heat exchange gas when heating the LCD substrate, and are connected to the center-section partition chamber 81 and the outside partition chamber 82 through gas-supply pipes 99 and 92, respectively. Additionally, the gas-supply pipes indicated by the reference signs 56-1 and 56-2 are connected to the center-section partition chamber 81 and the outside partition chamber 82 through the gas-supply pipes 99 and 92, respectively so as to supply the second heat exchange gas when cooling the LCD substrate. 63-1, 63-2, 73-1, and 73-2 are flow control parts, and 64-1, 64-2, 74-1, and 74-2 are valves.

Moreover, the placement part 41 is provided with a temperature-detecting part 111 which detects a temperature of the center-section area S1 of the LCD substrate 10 and a temperature-detecting elements 112 and 113 which detect temperatures of the outside area S2 of the LCD substrate 10. For example, a thermocouple is used for these temperature-detecting parts. The control part 100 takes the temperature detection results by these temperature detecting-parts 111-113, and sends control signals to the flow control parts (64-1, 64-2, 74-1, 74-2) so as to adjust, for example, a flow of the first or second heat exchange gas so that uniformity in the temperature in the surface of the LCD substrate is improved in accordance with the results.

As for the method for processing the detected values of the temperature, for example, if there is a plurality of temperature-detecting parts for detecting the temperature of each of the areas S1 and S2 (one and two in the example of FIG. 4 for the sake of convenience), and an average value of these temperature detection values is set as detection results. As the control method, if it is judged, for example, that the temperature of the center-section area S1 is higher than the temperature of the outside area S2 at the time of heating the LCD substrate 10, the flow adjustment parts 63-1 and 63-2 are controlled so that a flow of the first heat exchange gas with respect to the outside partition chamber 82 becomes large so as increase an amount of heat given from the first heat exchange gas to the outside area S2 to attempt uniformization of the temperature. Additionally, if it is judged, for example, that the temperature of the center-section area S1 is lower than the temperature of the outside area S2 at the time of cooling the LCD substrate 10, the flow adjustment parts 73-1 and 73-2 are controlled so that a flow of the second heat exchange gas becomes large with respect to the outside partition chamber 82 so as to increase an amount of heat taken by the second heat exchange gas from the outside area to attempt uniformization of the temperature.

According to the present embodiment, the in-plane uniformity of temperature when heating and cooling the LCD substrate can be further improved. In the above-mentioned embodiment, the number of divided areas of the LCD substrate 10 is not limited to two pieces, and may be three or more pieces. Additionally, it may be divided into left and right instead of dividing into the center area and the outside area. Furthermore, as for the control method, instead of adjusting a flow in accordance with temperature detection results, two systems may be prepared so as to adjust the gas temperature with respect to the temperature control part 62 or adjust both flow and temperature. When controlling temperature, if the temperature of the outside area S2 is lower than the center-section area S1 when cooling the LCD substrate 10 for example, a control is performed so that the temperature of the gas supplied to the outside area S2 is set higher than the gas supplied to the center-section area S1.

Figure 6:
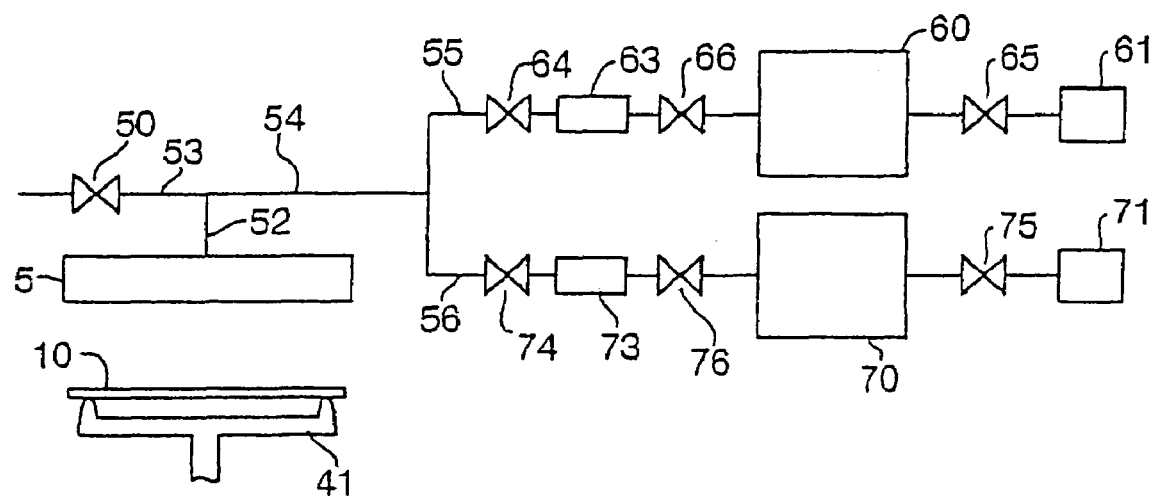
FIG. 6 is a structural diagram showing a part of a heat treatment apparatus according to a third embodiment of the present invention.

FIG. 6 is a diagram showing a third embodiment of the present invention. In this embodiment, an amount of heat exchange gas sufficient for one time heat exchange is accumulated in each of the gas-supply pipe 55 for the first heat exchange gas and the gas-supply pipe 56 for the second heat exchange gas. Moreover, for example, tanks 60 and 70 equipped with a temperature control part and valves 65, 66, 75 and 76 are provided. The capacity and internal pressure of the tanks 60 and 70 and the supply flows of the first and second heat exchange gas is set in accordance with a balance between an evacuation capacity of an exhaust pump which is connected to the exhaust pipe 46 and not illustrated, and a pressure inside the reaction container 4 at the time of start of heat exchange (start of heating or cooling).

In this example, when supplying the first heat exchange gas (second heat exchange gas) to the reaction container 4, after opening the valves 64 and 66 (74, 76) and completing a heat exchange, a gas is accumulated in the tank 60 (70) prior to a subsequent heat exchange.

According to such an approach, since the a temperature control can be achieved by previously accumulating a gas in the tank, a temperature control can be performed simply and certainly by acquiring data by performing experiments previously.

As mentioned above, according to the present invention, when applying a heat treatment to a glass substrate, a temperature can be changed (heating and/or cooling) rapidly with high uniformity over an entire surface, thereby acquiring a high throughput.

The present invention is not limited to the specifically disclosed embodiments, and variations and modifications may be made without departing from the scope of the present invention.

The invention claimed is:

1. A heat treatment apparatus comprising a carrier chamber into which and out of which a substrate is carried, a conveyance chamber for conveying the substrate and a hot-wall type heat treatment unit for heat-treating the substrate, said carrier chamber, conveyance chamber, and hot-wall type heat treatment unit being connected in an airtight manner, a glass substrate for liquid crystal displays being taken from a substrate carrier in the carrier chamber by conveying means in said conveyance chamber and being conveyed into said heat treatment unit in which a heat treatment is applied to the glass substrate, said apparatus further comprising:
    a placement part for placing the glass substrate in a reaction container;
    a gas supply part for supplying a gas for heat exchange to a surface of the glass substrate placed on the placement part;
    a temperature detecting part for detecting a temperature of the glass substrate placed on the placement part;
    a flow passage opening and closing part provided to a gas flow path for delivering the gas to said gas supply part; and
    a control part operatively configured to control the flow passage opening and closing part to supply a gas for heat exchange to said glass substrate based on the detected temperature of the glass substrate when raising a temperature inside said reaction container to a process temperature and/or decreasing the temperature of the reaction container after the heat treatment, the flow passage opening and closing part including an opening and closing valve which controls the supply of the gas for heat exchange in accordance with the detected temperature of the glass substrate.

2. The heat treatment apparatus as claimed in claim 1, wherein said gas supply part is provided so as to oppose to a surface of the glass substrate placed on said placement part, and the gas for heat exchange is blown to substantially the entire surface of the glass substrate.

3. The heat treatment apparatus as claimed in claim 1, further comprising a temperature adjusting part for previously adjusting a temperature of the gas for heat exchange to a predetermined temperature before the gas for heat exchange is supplied to inside said reaction container.

4. The heat treatment apparatus as claimed in claim 3, wherein the temperature adjusting part is adapted to control a temperature of the gas for heat exchange to be supplied to the glass substrate in accordance with the detected temperature of the glass substrate.

5. The heat treatment apparatus as claimed in claim 1, wherein said gas supply part supplies a first gas for heat exchange to the glass substrate when raising the temperature inside said reaction container to a process temperature, and supplies a second gas for heat exchange, which has a temperature lower than the temperature of said first gas for heat exchange, to said glass substrate when decreasing the temperature inside said reaction container after the heat treatment.

6. The heat treatment apparatus as claimed in claim 1, wherein said gas supply part is configured and arranged to divide the glass substrate placed in said reaction container into a plurality of areas and so as to supply independently a gas for heat exchange to each of the divided areas, and including:
    a temperature detecting part detecting a temperature of each of the divided areas of said glass substrate; and
    means for controlling at least one of an amount of flow and a temperature of the gas for heat exchange to be supplied to each divided area.

7. The heat treatment apparatus as claimed in claim 1, wherein a tank is provided on an upstream side of said flow passage opening and closing part for accumulating an amount of the gas for heat exchange necessary for one time heat exchange.

8. A heat treatment apparatus for heat treating a glass substrate for liquid crystal displays, said apparatus comprising:
    a carrier chamber into which and out of which a substrate is carried;
    a conveyance chamber including conveying means for conveying the substrate;
    a hot-wall type heat treatment unit for heat-treating the substrate, said carrier chamber, conveyance chamber, and hot-wall type heat treatment unit being connected in an airtight manner;
    a placement part for placing the glass substrate in a reaction container;
    a gas supply part for supplying a gas for heat exchange to a surface of the glass substrate placed on the placement part;
    a temperature detecting part for detecting a temperature of the glass substrate placed on the placement part;
    a flow passage opening and closing part provided to a gas flow path for delivering the gas to said gas supply part; and
    control means for controlling a supply of heat exchange gas to said reaction container when raising a temperature inside said reaction container to a process temperature and/or decreasing the temperature of the reaction container after the heat treatment, wherein the heat exchange gas supply is controlled based on the detected temperature of the glass substrate.

9. A heat treatment apparatus comprising:
    a hot-wall type heat treatment unit for heat-treating a substrate within a reaction chamber;
    a gas supply part for supplying a gas for heat exchange to a surface of the substrate;
    a temperature detection part for detecting a temperature of the substrate;

a flow passage opening and closing part provided to a flow path for delivering the gas for heat exchange to said gas supply part, the flow passage opening and closing part including an opening and closing valve which controls the supply of the gas for heat exchange in accordance with the detected temperature of the substrate;

a control part operatively configured to control the flow passage opening and closing part to supply the gas for heat exchange to said substrate based on the detected temperature of the substrate when raising a temperature inside said reaction container to a process temperature and/or decreasing the temperature of the reaction container after the heat treatment; and a temperature adjusting part for previously adjusting a temperature of the gas for heat exchange to a predetermined temperature before the gas for heat exchange is supplied to inside said reaction container.

* * * * *